(12) United States Patent
Zhou et al.

(10) Patent No.: US 10,385,442 B2
(45) Date of Patent: Aug. 20, 2019

(54) METHOD FOR PREPARING RARE-EARTH PERMANENT MAGNETIC MATERIAL WITH GRAIN BOUNDARY DIFFUSION USING COMPOSITE TARGET BY VAPOR DEPOSITION

(71) Applicant: ADVANCED TECHNOLOGY & MATERIALS CO., LTD., Haidian District, Beijing (CN)

(72) Inventors: Lei Zhou, Beijing (CN); Tao Liu, Beijing (CN); De Lin, Beijing (CN); Xiaojun Yu, Beijing (CN)

(73) Assignee: Advanced Technology & Materials Co., Ltd., Beijing (CN)

( * ) Notice: Subject to any disclaimer, the term of this patent is extended or adjusted under 35 U.S.C. 154(b) by 50 days.

(21) Appl. No.: 15/300,683

(22) PCT Filed: Nov. 6, 2015

(86) PCT No.: PCT/CN2015/093951
§ 371 (c)(1),
(2) Date: Sep. 29, 2016

(87) PCT Pub. No.: WO2016/176974
PCT Pub. Date: Nov. 10, 2016

(65) Prior Publication Data
US 2017/0037504 A1    Feb. 9, 2017

(51) Int. Cl.
*C23C 14/24*    (2006.01)
*C23C 14/02*    (2006.01)
(Continued)

(52) U.S. Cl.
CPC ............ *C23C 14/24* (2013.01); *C23C 14/021* (2013.01); *C23C 14/16* (2013.01);
(Continued)

(58) Field of Classification Search
None
See application file for complete search history.

(56) References Cited

U.S. PATENT DOCUMENTS 5,840,375 A * 11/1998 Katsumi ............... H01F 1/0577
427/127
6,399,146 B1 * 6/2002 Harris ..................... B22F 1/025
264/109
(Continued)

FOREIGN PATENT DOCUMENTS

CN   101163814 A   4/2008
CN   101331566 A   12/2008
(Continued)

OTHER PUBLICATIONS

International Search Report dated Jan. 15, 2016 for PCT/CN2015/093951, 6 pp.
(Continued)

*Primary Examiner* — Mandy C Louie
(74) *Attorney, Agent, or Firm* — United IP Counselors, LLC

(57) ABSTRACT

The present application provides a method for preparing a rare-earth permanent magnetic material with grain boundary diffusion using composite target by vapor deposition, in which the composite target is evaporated and attached to the surface of the NdFeB magnet, and in which medium-high temperature treatment and low temperature aging treatment are employed, resulting in that the coercive force of the magnet is improved significantly and the remanence and the magnetic energy product substantially are not reduced. The advantageous effects of the present application is as follows: the coercive force of the magnet is improved, and meanwhile the defects such as melting pits and crystal grain growth and the like caused by high temperature treatment
(Continued)

for the long time are eliminated, and the usage amount of heavy rare-earth is greatly reduced, thereby lowering the cost of the product.

15 Claims, 2 Drawing Sheets

(51) Int. Cl.
    *C23C 14/16*     (2006.01)
    *C23C 14/58*     (2006.01)
    *H01F 41/02*     (2006.01)

(52) U.S. Cl.
    CPC ..... *C23C 14/5806* (2013.01); *H01F 41/0266* (2013.01); *H01F 41/0293* (2013.01)

(56) References Cited

U.S. PATENT DOCUMENTS

| | | | |
|---|---|---|---|
| 6,444,052 B1 * | 9/2002 | Honkura | B22F 9/023 148/101 |
| 8,075,954 B2 | 12/2011 | Nagata et al. | |
| 8,673,392 B2 | 3/2014 | Nagata et al. | |
| 8,771,422 B2 | 7/2014 | Nagata et al. | |
| 2003/0041920 A1 * | 3/2003 | Hoshi | H01F 41/026 148/122 |
| 2003/0097905 A1 * | 5/2003 | Yamada | B24B 7/17 75/246 |
| 2006/0202564 A1 * | 9/2006 | Sakamoto | H02K 1/04 310/12.08 |
| 2007/0016131 A1 * | 1/2007 | Munger | A61M 25/0127 604/95.05 |
| 2008/0118747 A1 * | 5/2008 | Komatsu | C25D 5/12 428/336 |
| 2008/0257716 A1 | 10/2008 | Nagata et al. | |
| 2008/0286595 A1 * | 11/2008 | Yoshimura | B22F 7/062 428/548 |
| 2009/0020193 A1 * | 1/2009 | Ohta | H01F 1/0577 148/559 |
| 2009/0252865 A1 * | 10/2009 | Sagawa | B22F 3/1039 427/127 |
| 2009/0322459 A1 * | 12/2009 | Nagata | C23C 14/18 335/302 |
| 2010/0102910 A1 * | 4/2010 | Waeckerle | C21D 1/74 335/297 |
| 2010/0159129 A1 | 6/2010 | Nagata et al. | |
| 2010/0239878 A1 | 9/2010 | Nagata et al. | |
| 2011/0280761 A1 * | 11/2011 | Gong | C22C 45/10 420/423 |
| 2011/0293829 A1 | 12/2011 | Nagata et al. | |
| 2012/0112863 A1 * | 5/2012 | Kuniyoshi | B22F 3/24 335/302 |
| 2014/0328712 A1 * | 11/2014 | Sun | H01F 41/0293 419/27 |
| 2015/0194259 A1 | 7/2015 | Sun et al. | |

FOREIGN PATENT DOCUMENTS

| | | |
|---|---|---|
| CN | 101404195 A | 4/2009 |
| CN | 101517669 A | 8/2009 |
| CN | 101660126 A | 3/2010 |
| CN | 101660127 A | 3/2010 |
| CN | 101842862 A | 9/2010 |
| CN | 102242342 A | 11/2011 |
| CN | 101660127 B | 5/2012 |
| CN | 101517669 B | 7/2012 |
| CN | 101660126 B | 10/2012 |
| CN | 102751086 A | 10/2012 |
| CN | 103050268 A | 4/2013 |
| CN | 103140902 A | 6/2013 |
| CN | 103227022 A | 7/2013 |
| CN | 101842862 B | 8/2013 |
| CN | 103366943 A | 10/2013 |
| CN | 103824693 A | 5/2014 |
| CN | 102751086 B | 9/2014 |
| CN | 104040655 A | 9/2014 |
| CN | 102242342 B | 10/2014 |
| CN | 104900359 A | 9/2015 |
| DE | 112007002168 T5 | 9/2009 |
| DE | 112008002890 T5 | 9/2010 |
| JP | 2009200179 A | 9/2009 |
| JP | 2012188761 A | 10/2012 |
| JP | 2012211395 A | 11/2012 |
| JP | 5090359 B2 | 12/2012 |
| JP | 5247717 B2 | 7/2013 |
| JP | 5339722 B2 | 11/2013 |
| JP | 5433732 B2 | 3/2014 |
| KR | 20080019199 A | 3/2008 |
| KR | 20090065525 A | 6/2009 |
| KR | 20100069713 A | 6/2010 |
| KR | 20120075498 A | 7/2012 |
| KR | 101242465 B1 | 3/2013 |
| KR | 101271507 B1 | 6/2013 |
| KR | 20130070657 A | 6/2013 |
| KR | 101316803 B1 | 10/2013 |
| KR | 101456841 B1 | 11/2014 |
| RU | 2007138551 A | 4/2009 |
| RU | 2401881 C2 | 10/2010 |
| RU | 2009113823 A | 10/2010 |
| RU | 2010121865 A | 12/2011 |
| RU | 2010125811 A | 12/2011 |
| RU | 2010125813 A | 12/2011 |
| RU | 2447189 C2 | 4/2012 |
| RU | 2453942 C2 | 6/2012 |
| RU | 2490745 C2 | 8/2013 |
| TW | 200822154 A | 5/2008 |
| TW | 200935462 A | 8/2009 |
| TW | I427648 B | 2/2014 |
| TW | I430294 B | 3/2014 |
| TW | I437583 B | 5/2014 |
| WO | 2006100968 A1 | 9/2006 |
| WO | 2008032667 A1 | 3/2008 |
| WO | 2009057592 A1 | 5/2009 |

OTHER PUBLICATIONS

Office Action issue for corresponding Chinese Application No. 201510230782.2 dated Jul. 27, 2016, 7 pp.

Office Action issue for corresponding Chinese Application No. 201510230782.2 dated Mar. 1, 2017, 8 pp.

* cited by examiner

Machining the sintered magnet to thin slices

Cleaning the surface of the magnet

Treatment at medium-high temperature

Aging treatment at low temperature

METHOD FOR PREPARING RARE-EARTH PERMANENT MAGNETIC MATERIAL WITH GRAIN BOUNDARY DIFFUSION USING COMPOSITE TARGET BY VAPOR DEPOSITION

CROSS-REFERENCES TO RELATED APPLICATIONS

This application is the U.S. National Phase of PCT International Application No. PCT/CN2015/093951, filed on Nov. 6, 2015. That application claims priority to Chinese Patent Application No. CN201510230782.2, filed May 7, 2015. The contents of both applications are herein incorporated by reference in their entirety.

BACKGROUND

Field of the Application

The present application belongs to the technical field of rare-earth permanent magnetic materials, and specifically relates to a method for preparing a rare-earth permanent magnetic material with grain boundary diffusion using a composite target by vapor deposition, in which the composite metal film is formed on the surface of neodymium-ferrum-boron (NdFeB) by vapor deposition, and medium-high temperature treatment and low temperature aging treatment are carried out, so as to improve the performance of the magnets.

Background of the Application

The application of neodymium-ferrum-boron (NdFeB) permanent magnetic materials increases every day in the fields, such as hybrid vehicle, wind power generation and the like. These applications require magnets working at high temperature for a long time, therefore, it is necessary that the magnets having higher coercive force (Hcj) are needed. However, with thinning of the size of the NdFeB magnets machined, the coercive force is obviously decreased. Nd in principal phase $Nd_2Fe_{14}B$ of the magnet is replaced with a heavy rare-earth element such as Dy or Tb to form (Nd, $Dy)_2Fe_{14}B$ and (Nd, $Tb)_2Fe_{14}B$ of which the anisotropy is better than that of $Nd_2Fe_{14}B$, this is an effective method for improving the Hcj of the sintered NdFeB magnet. However, the heavy rare-earth element Dy or Tb as a resource is scarce and expensive; in addition, the magnetic moments of Nd and iron are arranged parallelly, and the magnetic moment of Dy and iron and the magnetic moment of Tb and iron are arranged anti-parallelly, which causes the decrease of the remanence Br and the maximum magnetic energy product $(BH)_{max}$ of the magnet. Thus, seeking a preparing and treating method for effectively improving the coercive force and slightly decreasing the remanence and magnetic energy product, has become a consensus in the research and manufacture fields of the NdFeB magnet, and a lot of teams have committed to such research.

Recently, many research teams or individuals have disclosed a variety of the treating technologies of grain boundary diffusion in which the rare-earth element is diffused into the inside of the matrix from the surface of the magnet. The treating technologies of grain boundary diffusion mainly adopts coating, deposition, plating, sputtering, sticking and the like to adhere metal powders (Dy, Tb, or other rare-earth elements) or compounds to the external surface of the magnet, and adopts heat treatment to diffuse the metal powders or compounds into the principal phase of the sintered magnet through grain boundary, which greatly affects the composition, microstructure and magnetic performance of the sintered NdFeB magnets. Among them, the main technologies are evaporation, sputtering and coating. Evaporation or sputtering technology is that Dy, Tb and other rare-earth elements are deposited on the surface of the sintered NdFeB magnet, and subsequently heat treatment and diffusion are conducted. Coating technology is that the rare-earth compounds such as fluoride or oxide powders are coated on the surface of the magnet, and then heating is conducted to diffuse. The permeated rare-earth elements can be optimally distributed along with the grain boundary and the surface area of the grain of principal phase by the aforementioned method, thus, the coercive force not only is improved, but also the usage amount of precious rare-earth is saved and the remanence and magnetic energy product are not reduced significantly. However, there still are some problems that need to be solved: (1) the method in which Dy or Tb is adhered to the surface of the sintered NdFeB magnet using sputtering is low in productivity, is too high in production cost, easily introduces the defects such as melting pits and the like, and is low in utilization of heavy rare-earth metals since a large amount of rare-earth metals is distributed in the furnace chamber during evaporation; (2) the disadvantage of the method in which the fluoride or oxide powder of Dy or Tb is adhered to the surface of the magnet and heating is conducted, or the disadvantage of the method in which magnet is filled into the mixed powders of fluoride or oxide powders of Dy or Tb and calcium hydride powders and heating is conducted is as follows: the procedure number is increased, the cost is high, in addition, for coating the surface with oxide or fluoride of rare-earth and heating to diffuse, there are problems of limiting the increase of the coercive force, making other elements enter into the magnet with diffusion and etc. After the NdFeB magnet is machined and the surface thereof is cleaned by water-washing, acid-washing and etc., the NdFeB magnet is in the state of being capable to conduct the surface treatment of ion plating such as nickel plating, aluminum plating and the like, and then fluoride or oxide powder are adhered to the surface of the NdFeB magnet and heating is conducted. The surface layer being composed of oxide or fluoride of Dy or Tb for displacing Nd is formed on the surface after heating. Though the operation for adhering fluoride or oxide powder is cheap, the process for removing the surface layer will also increase the cost of the magnet; (3) in addition, as Dy or Tb is expensive, the most efficient use of Dy or Tb is also a key problem in this kind of technology.

Vapor deposition is a process in which gas raw materials react on the surface of the solid substrate and are deposited to form a solid thin layer or a thin film. At present, the method for improving the coercive force performance of the magnets in which a composite metal made from the heavy rare-earth element Dy or Tb and other elements such as Cu, Nd, Al, Pr and the like is evaporated onto the surface of NdFeB using composite targets by vapor deposition and the grain boundary diffusion is generated, has not been reported.

SUMMARY

Application Object

For the disadvantages of the art, an object of the present application is to provide a method for preparing a rare-earth permanent magnetic material with grain boundary diffusion using composite target by vapor deposition, so as to improve the coercive force of the permanent magnet material and meanwhile to ensure the remanence and the magnetic energy product to be reduced hardly.

Technical Solution

In order to achieve the abovementioned object, the present application employs the following technical solutions.

A method for preparing a rare-earth permanent magnetic material with grain boundary diffusion using a composite target by vapor deposition, comprises:

step 1 of: preparing the composite target having the chemical formula of $H_{100-x-y}M_xQ_y$, wherein: H is Dy or/and Tb, M is Nd or/and Pr, Q is one or more elements selected from the group of Cu, Al, Zn and Sn, x being in the range of 0 to 20 and y being in the range of 0 to 40 are atom percentage of corresponding composition in the composite target, and x and y can not be zero simultaneously;

step 2 of: machining a sintered NdFeB magnet to the magnet with required shape and size, and then cleaning the surface of the magnet and drying, thereby obtaining a NdFeB magnet to be treated;

step 3 of: alternately stacking the composite target and the NdFeB magnet to be treated in turn and being placed in a processing equipment, the topmost layer and the bottommost layer being the composite targets, coating the surface of the NdFeB magnet to be treated with the metal film under the specified condition (namely, at medium-high temperature) using the composite target as an evaporation source and generating grain boundary diffusion, and then cooling along with the processing equipment, thereby obtaining a NdFeB magnet which has generated diffusion; and step 4 of: tempering the NdFeB magnet which has generated diffusion (namely, aging the NdFeB magnet which has generated diffusion at low temperature) to uniformly coat the outside of the primary phase particles with the grain boundary phase, thereby obtaining a magnet of which the performance is improved.

As a preferred embodiment, in step 1 of the aforementioned method, x of the composite target $H_{100-x-y}M_xQ_y$ is in the range of 0 to 5, y of the composite target $H_{100-x-y}M_xQ_y$ is in the range of 1 to 10. The composite target more preferably is $Tb_{95}Cu_5$, $Tb_{98}Al_2$ or $Tb_{95.9}Dy_{0.4}Nd_{0.7}Zn_2Sn_1$.

As a preferred embodiment, in step 1 of the aforementioned method, the composite target is prepared by the method comprising: weighing the corresponding raw material according to atom percentage of each composition of the composite target; and forming the composite target with required size by smelting, casting, forging, hot-rolling, cool-rolling and machining in turn. The density of the composite target is improved by forging, hot-rolling and cool-rolling, thereby affecting working life and evaporativity of the target. The thickness of the composite target affects the strength of the target and the effect of subsequent penetration treatment. For composite targets with the same weight, under the same treatment condition, the composite target with the larger superficial area, namely the composite target with the thinner thickness, has more obvious penetration performance. Preferably, the required size of the composite target is 0.5 to 3 mm in thickness, 180 to 300 mm in length and 100 to 240 mm in width. Preferably, the smelting is conducted using a vacuum medium frequency induction furnace, and the vacuum degree is not higher than $10^{-2}$ Pa (such as 0.05 Pa, 0.1 Pa, 0.5 Pa, 1 Pa, 2 Pa and 3 Pa), and more preferably, the vacuum degree is $10^{-2}$-1 Pa.

As a preferred embodiment, in step 2 of the aforementioned method, the process of cleaning the surface is as follows: placing the NdFeB magnet in a degreasing tank and soaking for 10 to 15 minutes to remove the greasy dirt of the surface of the magnet firstly, and then performing the first water-washing, acid-washing, the second water-washing and ultrasonic treatment in turn, and finally drying the surface of the NdFeB magnet using wind. Preferably, the time of the acid-washing is in the range of 20 to 45 seconds (such as 22 s, 28 s, 35 s, 39 s and 44 s), the time of the ultrasonic treatment is in the range of 20 to 45 seconds (such as 22 s, 28 s, 35 s, 39 s and 44 s).

There is no strict requirement for the size of NdFeB magnet to be treated in the aforementioned method. As a preferred embodiment, the thickness of the NdFeB magnet to be treated is in the range of 1 to 8 mm (such as 2 mm, 4 mm, 6 mm and 7 mm) in the orientation direction. The method of the present application can be used to treat the NdFeB magnets with simple planar shape such as square, circle and the like.

As a preferred embodiment, in step 3 of the aforementioned method, one piece of the NdFeB magnet to be treated is sandwiched between two pieces of the composite target, and the superficial area of the composite target is larger than that of the NdFeB magnet to be treated.

As a preferred embodiment, in step 3 of the aforementioned method, the specified condition is as follows: the vacuum degree is not more than $10^{-3}$ Pa (such as $5\times10^{-4}$ Pa, $1\times10^{-4}$ Pa, $8\times10^{-5}$ Pa, $5\times10^{-5}$ Pa and $1\times10^{-6}$ Pa), the holding temperature is in the range of 650 to 900° C. (such as 650° C., 700° C., 750° C., 800° C., 850° C. and 900° C.), and the holding time is in the range of 5 to 50 hours (such as 6 h, 10 h, 20 h, 30 h, 40 h and 48 h); the temperature after cooling along with the processing equipment is no more than 50° C. (such as 25° C., 30° C., 35° C., 40° C. and 45° C.). More preferably, the holding temperature in step 3 is in the range of 700 to 850° C., the holding time in step 3 is in the range of 5 to 35 h.

As a preferred embodiment, in step 4 of the aforementioned method, the condition of the tempering treatment is as follows: the tempering temperature is in the range of 420 to 640° C. (such as 420° C., 460° C., 500° C., 550° C., 600° C. and 630° C.), the tempering time is in the range of 2 to 10 hours (such as 3 h, 4 h, 6 h, 8 h and 9 h), the NdFeB magnet naturally is cooled to room temperature after tempering treatment.

The processing equipment in step 3 of the aforementioned method can be a vacuum heat treatment furnace.

The key to the technology of step 3 in the aforementioned method is that the disadvantage of distributing a large amount of rare-earth metal in the furnace chamber for vapor deposition method to result in the low utilization rate of heavy rare-earth metals is overcome, and that an additive performance of reducing redundant adhesion by the effective use of the evaporation amount of rare-earth can be generated to improve the utilization rate of the material.

In the present application, a metal film which contains heavy rare-earth elements and auxiliary metal elements is formed on the surface of the sintered NdFeB magnet at medium-high temperature using the composite metal target as a high-temperature evaporation source. Evaporation, adhesion and grain boundary diffusion are occurred simultaneously, the heavy rare-earth elements and the auxiliary metals are diffused into the magnet through grain boundary at the temperature for certain time, and the substitution reaction is occurred between the heavy rare-earth elements and Nd of $Nd_2Fe_{14}B$ at the boundary of the principal phase, so as to form $(Nd, H)_2Fe_{14}B$ phase with high anisotropy. Referring to FIG. 2, a reticular transition zone can be seen obviously in the microstructure. The transition zone can make magnets control the growth of the domain nuclear with reversal magnetization in the reversal magnetization process, thus, the coercive force of the magnet is increased by 4000~13000 Oe, and the remanence thereof is reduced by less than 4.5%. When the coercive force of the magnet is improved by the same amount, in comparison with the traditional method for improving the performance of the magnet (i.e., rare-earth elements like Dy, Tb and etc., was deposited on the surface of the NdFeB magnet using vapor deposition technology), the usage amount of the heavy rare-earth can be reduced by 10 to 20% in the present application, and meanwhile the decrease rate of the remanence is very low.

The method of the present application is a method in which the metal containing heavy rare-earth elements and auxiliary elements with good wettability is condensed and attached to the surface of the NdFeB and medium-high temperature treatment is conducted. In the present application, the composite target which is made from the materials with different melting points is used as the material of evaporation source. Since forces among particles inside materials is different, the internal energy of the integral alloy target is increased, resulting in that the melting point thereof is decreased, which makes the composite target have a low evaporation temperature (namely a low treating temperature) in comparison with the pure metal targets.

Beneficial Effects

The method for preparing the composite target is simple, the diffusion temperature of the composite target deposited by the vapor deposition is lower than that of other grain boundary diffusion technologies and can ensure the heavy rare-earth elements to gather in the common boundary area of the principal phase and rich neodymium phase, thus, the coercive force of the NdFeB magnet is improved remarkably. The present application provides a novel route for improving the performance of rare-earth permanent magnetic material NdFeB. Using the method of the present application improves the performance of the magnet, on the one hand, the efficiency is high, on the other hand, the usage amount of heavy rare-earth is greatly reduced, thereby reducing the cost of the product and making the product have higher performance cost ratio; in addition, the defects like melting pits, the growth of crystalline grain and etc. brought by treatment at high temperature for a long time also can be eliminated. The auxiliary metal elements used are easy to dissolve in liquid Nd-rich phase at high temperature, which helps to improve the flowability and wettability of the Nd-rich phase with high temperature, thereby being more conducive to grain boundary diffusion, and which also obviously improves the corrosion resistance of the magnet. The method for preparing rare-earth permanent magnetic material NdFeB with grain boundary diffusion using composite target by vapor deposition, can effectively reduce the treating temperature of grain boundary diffusion, thereby achieving the grain boundary diffusion at low temperature. On the one hand, the method can effectively control the evaporation amount, thereby improving the utilization rate of the evaporation materials; On the other hand, the grain boundary diffusion treatment at low temperature can avoid the defects such as melting pits, the abnormal growth of crystalline grain and the like of the magnet, thereby improving the yield of the magnet by the grain boundary diffusion treatment. In addition, the corrosion resistance and mechanical performances of the magnet are improved significantly by the addition of the non-heavy rare-earth elements.

DETAILED DESCRIPTION OF THE EMBODIMENTS

Hereafter, the present application will be further described in combination with embodiments, the embodiments of the present application is only used to explain the present application without limiting the present application.

The NdFeB magnet to be treated used in the following method is a sintered NdFeB magnet, the sintered NdFeB magnets used in each embodiment are the same batch and the same type.

Figures 1, 2:
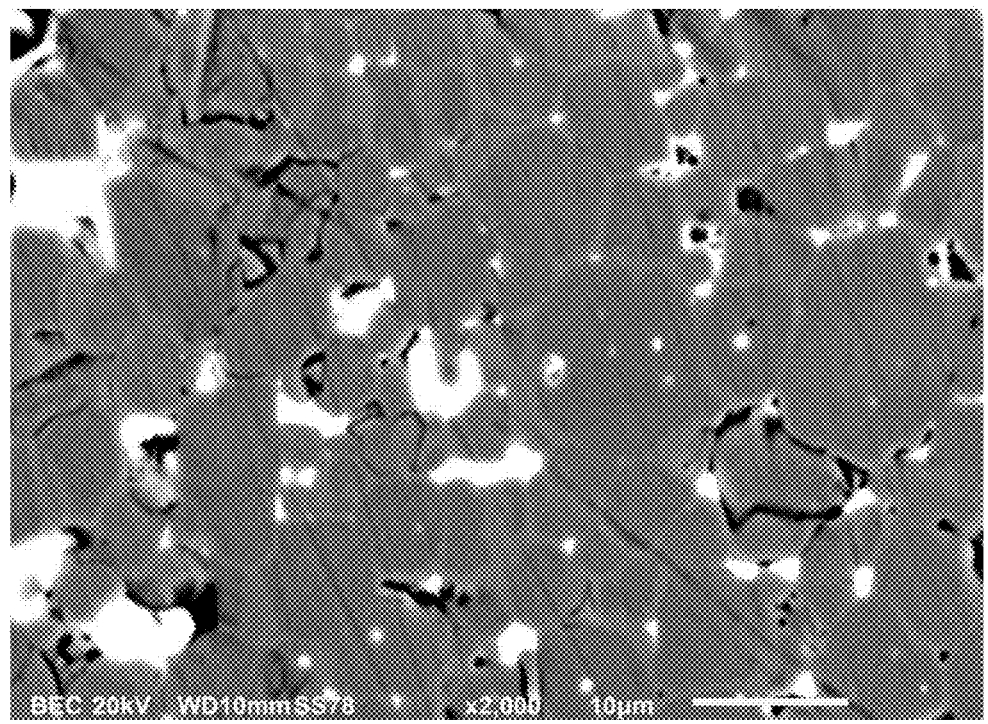
FIG. 1 is a flow chart of the method in the present application.
FIG. 2 is a microstructure picture of the magnet finally obtained in embodiment 1 of the present application.

FIG. 1 shows the process flow of the method in the present application, including the following steps: machining the sintered magnet to thin slices, cleaning the surface of the magnet, treating at medium-high temperature and aging treating at low temperature. Specific embodiments are provided below.

Embodiment 1

(1) Preparation of composite target $Tb_{98}Cu_2$ (in which subscript is atom percentage content of the corresponding element) is as follows: elementary substance Tb (of which the purity is 99.95%) and Cu powder (of which the purity is 99.95%), as raw materials, are weighed according to the ratio of the chemical formula of the composite target, and followed by being placed in a vacuum medium frequency induction furnace and being smelted under the condition of vacuum degree of $10^{-2}$ Pa at the temperature of 1040° C. for 15 min, and then the molten alloy liquid is cast to a casting blank, next, the composite target with the thickness of 2 mm, the length of 240 mm and the width of 160 mm is made by forging, hot-rolling, cool-rolling and machining; and then the oxide skin and etc. on the surface of the composite target are removed to keep the planeness of the target surface.

(2) The large sintered NdFeB magnet is machined by machining to the sintered magnet with the size shown in Table 1, and followed by being placed in a degreasing tank and being soaked for 10 min to remove the greasy dirt on the surface of the magnet, and then the surface is washed with water, with dilute nitric acid (of which concentration is 0.5 wt %) for about 40 s, and with water in turn, next, ultrasonic treatment is conducted for 35 s, and finally rapid drying is conducted using strong wind, thereby obtaining the NdFeB magnet to be treated.

(3) One piece of the NdFeB magnet to be treated in step (2) is sandwiched between two pieces of the composite target obtained in step (1), and then they are placed into a vacuum heat treatment furnace and treated at 700° C. for 24 hours under the condition of vacuum degree of $10^{-4}$ Pa using the composite target as an evaporation source; and followed by being cooled to about 50° C. with the furnace.

(4) The NdFeB magnet treated in step (3) is placed into a tempering furnace, the tempering treatment is conducted at 500° C. for 5 hours, and followed by naturally being cooled to room temperature, thereby obtaining the magnet of which the performance is improved.

Referring to FIG. 2, it is a microstructure picture of the magnet obtained in the present embodiment, in comparison with the traditional methods (such as the method described in the patent, the publication number of which is CN101404195), the full reticular structure in the microstructure of the magnet prepared by the traditional method can not be seen (referring to FIG. 1 in the patent, the public number of which is CN101404195); however, the reticular structure in the microstructure of the magnet in this embodiment of the present application is observed obviously, which shows that the surface of the principal phase particle is coated with a continuous rare-earth-rich thin layer. On the one hand, the thin layer can prevent the domain nuclear with reversal magnetization from nucleating and growing in a low external field; on the other hand, the thin layer also has a very good demagnetizing-coupling effect on the principal phase particles. Therefore, the coercive force can be significantly improved. At the same time, the amount of the heavy rare-earth elements Dy and Tb contained is low, the drop of the remanence is greatly lowered.

Figure 3:
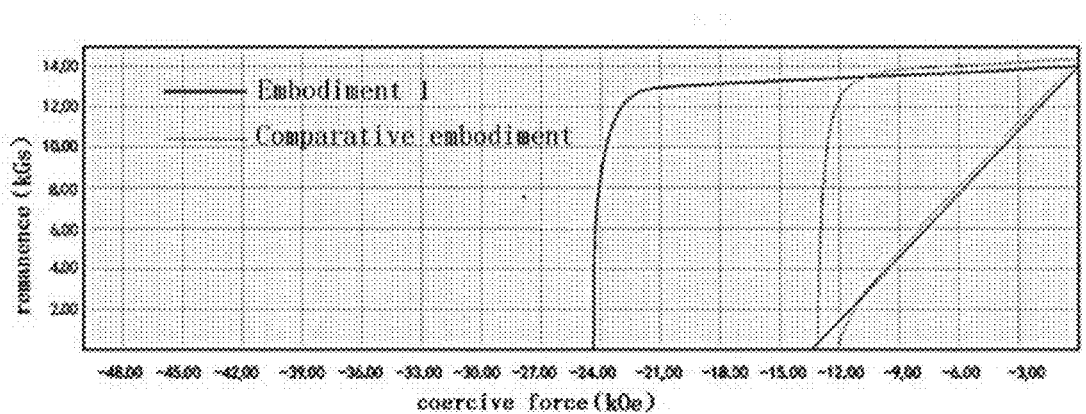
FIG. 3 is a performance variation curve of the magnet before treatment and the magnet after treatment in embodiment 1 of the present application.

The performances of the magnets before treatment and that after treatment using the method of the present embodiment are tested according to the standard of GB/T3217-1992. The magnet after tempering treatment is cut into a cylinder with the diameter of 10 mm, by the test, in comparison with the magnet before the medium-high treatment and low temperature aging treatment, the magnet after the medium-high treatment and low temperature aging treatment is increased by 10990 Oe in coercive force, is slightly reduced and reduced by 330 Gs in remanence, the decrease rate of the remanence is 2.3%, as shown in FIG. 3. The performance of the NdFeB magnet which has been treated using steps (3) and (4) and the performance of the NdFeB magnet which has not been treated using steps (3) and (4) are shown in Table 1, that is to say, the NdFeB magnet which has not been treated using steps (3) and (4) is the magnet in the comparative embodiment shown in FIG. 3, the NdFeB magnet which has been treated using steps (3) and (4) is the magnet of which the performance is improved in the present application.

Embodiment 2

(1) Preparation of composite target $Tb_{95}Cu_5$ (in which subscript is atom percentage content of the corresponding element) is as follows: elementary substance Tb (of which the purity is 99.95%) and Cu powder (of which the purity is 99.95%), as raw materials, are weighed according to the ratio of the chemical formula of the composite target, and followed by being placed in a vacuum medium frequency induction furnace and being smelted under the condition of vacuum degree of $10^{-2}$ Pa at the temperature of 1042° C. for 15 min, and then the molten alloy liquid is cast to a casting blank, next, the target with the thickness of 2.2 mm, the length of 220 mm and the width of 140 mm is made by forging, hot-rolling, cool-rolling and machining; and then the oxide skin and etc. on the surface of the target are removed to keep the planeness of the target surface.

(2) The sintered NdFeB magnet is machined by a sintering magnet machine to the sintered magnet with the size shown in Table 1, and then the surface is cleaned and dried using wind, of which specific content is the same as step (2) of embodiment 1.

(3) One piece of the NdFeB magnet to be treated in step (2) is sandwiched between two pieces of the composite target obtained in step (1), and then they are placed into a vacuum heat treatment furnace and treated at 690° C. for 30 hours under the condition of vacuum degree of $10^{-4}$ Pa; and followed by being cooled to about 45° C. with the furnace.

(4) The NdFeB magnet treated in step (3) is placed into a tempering furnace, the tempering treatment is conducted at 510° C. for 5 hours, and followed by naturally being cooled to room temperature, thereby obtaining the magnet of which the performance is improved.

The microstructure of the magnet obtained in this embodiment basically is the same as the microstructure shown in FIG. 2, which is not provided repeatedly herein. It can be seen from the figure that the reticular structure in the microstructure of the magnet in this embodiment of the present application is observed obviously, which shows that the surface of the principal phase particle is coated with a continuous rare-earth-rich thin layer. On the one hand, the thin layer can prevent the domain nuclear with reversal magnetization from nucleating and growing in a low external magnetic field; on the other hand, the thin layer also has a very good demagnetizing-coupling effect on the principal phase particles. Therefore, the coercive force can be significantly improved. At the same time, the amount of the heavy rare-earth elements Dy and Tb contained is low, the drop of the remanence is greatly lowered.

The performance of the magnet obtained using the method of the present embodiment is tested according to the method for testing the performance of the magnet in embodiment 1. The result shows that the magnet is increased by 8510 Oe in coercive force, and is slightly reduced and reduced by 280 Gs in remanence, the decrease rate of the remanence is 2%. The performance of the NdFeB magnet which has been treated using steps (3) and (4) and the performance of the NdFeB magnet which has not been treated using steps (3) and (4) are shown in Table 1.

Embodiment 3

(1) Preparation of composite target $Tb_{97}Nd_1Al_2$ (in which subscript is atom percentage content of the corresponding element) is as follows: elementary substance Tb (of which the purity is 99.95%), elementary substance Nd (of which the purity is 99.95%) and Cu powder (of which the purity is 99.95%), as raw materials, are weighed according to the ratio of the chemical formula of the composite target, and followed by being placed in a vacuum medium frequency induction furnace and being smelted under the condition of vacuum degree of $10^{-2}$ Pa at the temperature of 1040° C. for 15 min, and then the molten alloy liquid is cast to a casting blank, next, the composite target with the thickness of 3.0 mm, the length of 200 mm and the width of 110 mm is made by forging, hot-rolling, cool-rolling and machining; and then the oxide skin and etc. of the surface of the target are removed to keep the planeness of the target surface.

(2) The sintered NdFeB magnet is machined by a sintering magnet machine to the sintered magnet with the size shown in Table 1, and then the surface is cleaned and dried using wind, of which specific content is the same as the step (2) of embodiment 1.

(3) One piece of the NdFeB magnet to be treated in step (2) is sandwiched between two pieces of the composite target obtained in step (1), and then they are placed into a vacuum heat treatment furnace and treated at 820° C. for 35 hours under the condition of vacuum degree of $5 \times 10^{-4}$ Pa; and followed by being cooled to about 40° C. with the furnace.

(4) The NdFeB magnet treated in step (3) is placed into a tempering furnace, the tempering treatment is conducted at 470° C. for 5 hours, and followed by naturally being cooled to room temperature.

The microstructure of the magnet obtained in this embodiment basically is the same as the microstructure shown in FIG. 2, which is not provided repeatedly herein. It can be seen from the figure that the reticular structure in the microstructure of the magnet in this embodiment of the present application is observed obviously, which shows the surface of the principal phase particle is coated with a continuous rare-earth-rich thin layer. On the one hand, the thin layer can prevent the domain nuclear with reversal magnetization from nucleating and growing in a low external magnetic field; on the other hand, the thin layer also has a very good demagnetizing-coupling effect on the principal phase particles. Therefore, the coercive force can be significantly improved. At the same time, the amount of the heavy rare-earth elements Dy and Tb contained is low, the drop of the remanence is greatly lowered.

The performance of the magnet obtained using the method of the present embodiment is tested according to the method for testing the performance of the magnet in embodiment 1. The result shows that the magnet is increased by 7640 Oe in coercive force, and is slightly reduced and reduced by 40 Gs in remanence, the decrease rate of the remanence is 0.3%. The performance of the NdFeB magnet which has been treated using steps (3) and (4) and the performance of the NdFeB magnet which has not been treated using steps (3) and (4) are shown in Table 1.

Embodiment 4

(1) Preparation of composite target $Dy_{98}Al_2$ (in which subscript is atom percentage content of the corresponding element) is as follows: elementary substance Dy (of which the purity is 99.95%) and Al powder (of which the purity is 99.95%), as raw materials, are weighed according to the ratio of the chemical formula of the composite target, and followed by being placed in a vacuum medium frequency induction furnace and being smelted at the temperature of 1048° C. for 15 min, and then the molten alloy liquid is cast to a casting blank, next, the composite target with the thickness of 2.0 mm, the length of 190 mm and the width of 110 mm is made by forging, hot-rolling, cool-rolling and machining; and then the oxide skin and etc. of the surface of the target are removed to keep the planeness of the target surface.

(2) The sintered NdFeB magnet is machined by a sintering magnet machine to the sintered magnet with the size shown in Table 1, and then the surface is cleaned and dried using wind, of which specific content is the same as the step (2) of embodiment 1.

(3) One piece of the NdFeB magnet to be treated in step (2) is sandwiched between two pieces of the composite target obtained in step (1), and then they are placed into a vacuum heat treatment furnace and treated at 790° C. for 30 hours under the condition of vacuum degree of $10^{-4}$ Pa; and followed by being cooled to about 50° C. with the furnace.

(4) The NdFeB magnet treated in step (3) is placed into a tempering furnace, the tempering treatment is conducted at 460° C. for 5 hours, and followed by naturally being cooled to room temperature.

The microstructure of the magnet obtained in this embodiment basically is the same as the microstructure shown in FIG. 2, which is not provided repeatedly herein. It can be seen from the figure that the reticular structure in the microstructure of the magnet in this embodiment of the present application is observed obviously, which shows that the surface of the principal phase particle is coated with a continuous rare-earth-rich thin layer. On the one hand, the thin layer can prevent the domain nuclear with reversal magnetization from nucleating and growing in a low external magnetic field; on the other hand, the thin layer also has a very good demagnetizing-coupling effect on the principal phase particles. Therefore, the coercive force can be significantly improved. At the same time, the amount of the heavy rare-earth elements Dy and Tb contained is low, the drop of the remanence is greatly lowered.

The performance of the magnet obtained using the method of the present embodiment is tested according to the method for testing the performance of the magnet in embodiment 1. The result shows that the magnet is increased by 4100 Oe in coercive force, and is slightly reduced and reduced by 240 Gs in remanence, the decrease rate of the remanence is 1.7%. The performance of the NdFeB magnet which has been treated using steps (3) and (4) and the performance of the NdFeB magnet which has not been treated using steps (3) and (4) are shown in Table 1.

Embodiment 5

(1) Preparation of composite target $Tb_{98}Al_2$ (in which subscript is atom percentage content of the corresponding element) is as follows: elementary substance Tb (of which the purity is 99.95%) and Al powder (of which the purity is 99.95%), as raw materials, are weighed according to the ratio of the chemical formula of the composite target, and followed by being placed in a vacuum medium frequency induction furnace and being smelted under the condition of vacuum degree of $10^{-2}$ Pa at the temperature of 1039° C. for 15 min, and then the molten alloy liquid is cast to a casting blank, next, the composite target with the thickness of 1.5 mm, the length of 200 mm and the width of 140 mm is made by forging, hot-rolling, cool-rolling and machining; and then the oxide skin and etc. of the surface of the target are removed to keep the planeness of the target surface.

(2) The sintered NdFeB magnet is machined by a sintering magnet machine to the sintered magnet with the size shown in Table 1, and then the surface is cleaned and dried using wind, of which specific content is the same as the step (2) of embodiment 1.

(3) One piece of the NdFeB magnet to be treated in step (2) is sandwiched between two pieces of the composite target obtained in step (1), and then they are placed into a vacuum heat treatment furnace, heat preservation is conducted at 835° C. for 35 hours under the condition of vacuum degree of $10^{-4}$ Pa; and followed by being cooled to about 50° C. with the furnace.

(4) The NdFeB magnet treated in step (3) is placed into a tempering furnace, the tempering treatment is conducted at 450° C. for 5 hours, and followed by naturally being cooled to room temperature.

The microstructure of the magnet obtained in this embodiment basically is the same as the microstructure shown in FIG. 2, which is not provided repeatedly herein. It can be seen from the figure that the reticular structure in the microstructure of the magnet in this embodiment of the present application is observed obviously, which shows that the surface of the principal phase particle is coated with a continuous rare-earth-rich thin layer. On the one hand, the thin layer can prevent the domain nuclear with reversal magnetization from nucleating and growing in a low external magnetic field; on the other hand, the thin layer also has a very good demagnetizing-coupling effect on the principal phase particles. Therefore, the coercive force can be significantly improved. At the same time, the amount of the heavy rare-earth elements Dy and Tb contained is low, the drop of the remanence is greatly lowered.

The performance of the magnet obtained using the method of the present embodiment is tested according to the method for testing the performance of the magnet in embodiment 1. The result shows that the magnet is increased by 7180 Oe in coercive force, and is slightly reduced and reduced by 220 Gs in remanence, the decrease rate of the remanence is 1.7%. The performance of the NdFeB magnet which has been treated using steps (3) and (4) and the performance of the NdFeB magnet which has not been treated using steps (3) and (4) are shown in Table 1.

Embodiment 6

(1) Preparation of composite target $Tb_{95.9}Dy_{0.4}Nd_{0.7}Zn_2Sn_1$ (in which subscript is atom percentage content of the corresponding element) is as follows: elementary substance Tb (of which the purity is 99.95%), elementary substance Dy (of which the purity is 99.95%), elementary substance Nd (of which the purity is 99.95%), elementary substance Zn (of which the purity is 99.95%), and elementary substance Sn (of which the purity is 99.95%), as raw materials, are weighed according to the ratio of the chemical formula of the composite target, and followed by being placed in a vacuum medium frequency induction furnace and being smelted at the temperature of 1041° C. for 15 min, and then the molten alloy liquid is cast to a casting blank, next, the composite target with the thickness of 1.5 mm, the length of 200 mm and the width of 150 mm is made by forging, hot-rolling, cool-rolling and machining; and then the oxide skin and etc. of the surface of the target are removed to keep the planeness of the target surface.

(2) The sintered NdFeB magnet is machined by a sintering magnet machine to the sintered magnet with the size shown in Table 1, and then the surface is cleaned and dried using wind, of which specific content is the same as the step (2) of embodiment 1.

(3) One piece of the NdFeB magnet to be treated in step (2) is sandwiched between two pieces of the composite target obtained in step (1), and then they are placed into a vacuum heat treatment furnace, heat preservation is conducted at 800° C. for 35 hours under the condition of vacuum degree of $10^{-4}$ Pa; and followed by being cooled to about 50° C. with the furnace.

(4) The NdFeB magnet treated in step (3) is placed into a tempering furnace, the tempering treatment is conducted at 490° C. for 5 hours, and followed by naturally being cooled to room temperature.

The microstructure of the magnet obtained in this embodiment basically is the same as the microstructure shown in FIG. 2, which is not provided repeatedly herein. It can be seen from the figure that the reticular structure in the microstructure of the magnet in this embodiment of the present application is observed obviously, which shows that the surface of the principal phase particle is coated with a continuous rare-earth-rich thin layer. On the one hand, the thin layer can prevent the domain nuclear with reversal magnetization from nucleating and growing in a low external magnetic field; on the other hand, the thin layer also has a very good demagnetizing-coupling effect on the principal phase particles. Therefore, the coercive force can be significantly improved. At the same time, the amount of the heavy rare-earth elements Dy and Tb contained is low, the drop of the remanence is greatly lowered.

The performance of the magnet obtained using the method of the present embodiment is tested according to the method for testing the performance of the magnet in embodiment 1. The result shows that the magnet is increased by 9060 Oe in coercive force, and is slightly reduced and reduced by 60 Gs in remanence, the decrease rate of the remanence is 0.5%. The performance of the NdFeB magnet which has been treated using steps (3) and (4) and the performance of the NdFeB magnet which has not been treated using steps (3) and (4) are shown in Table 1.

TABLE 1 the testing results of the performance of the magnets from six embodiments

| Embodiment No. | Size of permanent magnet | Coercive force (kOe) | | Remanence (kGs) | |
| --- | --- | --- | --- | --- | --- |
| | | Before treatment | After treatment | Before treatment | After treatment |
| Embodiment 1 | 11 * 12 * 4 mm | 13.08 | 24.07 | 14.37 | 14.04 |
| Embodiment 2 | 42 * 15 * 4.3 mm | 17.53 | 26.04 | 13.84 | 13.56 |
| Embodiment 3 | 36.3 * 15 * 6 mm | 24.88 | 32.52 | 13.3 | 13.26 |
| Embodiment 4 | 22 * 11 * 5.5 mm | 17.35 | 21.45 | 13.9 | 13.66 |
| Embodiment 5 | 50 * 15 * 5.95 mm | 24.63 | 31.81 | 13.03 | 12.81 |
| Embodiment 6 | 24 * 12 * 6 mm | 32.26 | 41.32 | 11.83 | 11.77 |

The result of each embodiment in Table 1 shows that the coercive force is improved by 4100Oe-10990Oe and the remanence only is reduced by 0.3%-2.3%, these results are obtained under the preferred conditions.

Embodiments 7 to 15

In order to better demonstrate that different composite targets have an effect on the performance of the magnet in the present application, embodiments 7 to 15 and comparative embodiment 1 are illustrated below, the chemical formula of each composite target in embodiments 7 to 15 is shown in Table 2, the method for preparing the magnets in each embodiment and the comparative embodiment is the same as that of embodiment 1, the size of the magnets which has not been treated in each embodiment and the comparative embodiment are the same as that of embodiment 1, the size of the composite target is the same as that of embodiment 1, the method for testing the performance of the magnets obtained in each embodiment and the comparative example are the same as that of embodiment 1, the testing results refer to Table 2.

TABLE 2 the testing results of the performance of the magnets from embodiments 7 to 15 and comparative embodiment 1

| Embodiment No. | Chemical formula of composite target | Coercive force (kOe) | | Remanence (kGs) | |
|---|---|---|---|---|---|
| | | Before treatment | After treatment | Before treatment | After treatment |
| Embodiment 7 | $Tb_{97}Cu_3$ | 13.08 | 24.11 | 14.37 | 14.14 |
| Embodiment 8 | $Tb_{94}Cu_6$ | 13.08 | 23.23 | 14.37 | 14.21 |
| Embodiment 9 | $Tb_{97}Nd_2Al_1$ | 13.08 | 23.56 | 14.37 | 14.13 |
| Embodiment 10 | $Dy_{99}Al_1$ | 13.08 | 19.78 | 14.37 | 14.17 |
| Embodiment 11 | $Tb_{97}Al_3$ | 13.08 | 23.66 | 14.37 | 14.08 |
| Embodiment 12 | $Tb_{94}Dy_{0.8}Nd_{1.2}Zn_1Sn_3$ | 13.08 | 23.85 | 14.37 | 14.06 |
| Embodiment 13 | $Tb_{98}Cu_1Al_1$ | 13.08 | 24.17 | 14.37 | 14.07 |
| Embodiment 14 | $Tb_{65}Al_{35}$ | 13.08 | 20.21 | 14.37 | 14.18 |
| Embodiment 15 | $Tb_{90}Al_{10}$ | 13.08 | 22.17 | 14.37 | 14.10 |
| Comparative embodiment 1 | $Tb_{20}Dy_{38}Al_{42}$ | 13.08 | 16.50 | 14.37 | 14.27 |

Embodiments 16 to 23

In order to better demonstrate that the holding temperature in step (3) of the present application and the tempering temperature in step (4) of the present application have effect on the performance of the magnet, embodiments 16 to 23 are illustrated below. In embodiments 16 to 23, other parameters are the same as that of embodiment 1 except that the holding temperature in step (3) and the tempering temperature in step (4) are different from that of embodiment 1, the method for testing the performance of the magnet from each embodiment is the same as that of embodiment 1, the testing results refer to Table 3. At the same time, comparative embodiments are provided. In comparative embodiments 2 and 3, other parameters are the same as that of embodiment 1 except that the holding temperature in step (3) and the tempering temperature in step (4) are different from that of embodiment 1, the testing results refer to Table 3.

It can be seen from Table 3 that the holding temperature and the tempering temperature have a significant influence on the coercive force and remanence of the magnets.

The invention claimed is:

1. A method for preparing a rare-earth permanent magnetic material, said method comprising:
    (1): preparing two composite targets having a chemical formula of $Tb_{95}Cu_5$,
    (2): machining a sintered NdFeB magnet to produce a magnet with required shape and size, and then cleaning a surface of the magnet with required shape and size and drying, thereby obtaining a NdFeB magnet to be treated;
    (3): alternately stacking the two composite targets and the NdFeB magnet to be treated, such that both of a topmost layer and a bottommost layer of the stack are the composite targets, placing the stack in processing equipment, coating the surface of the NdFeB magnet to be treated with a metal film under a specified condition using the composite target as an evaporation source and thereby generating grain boundary diffusion, wherein the specified condition is both a holding temperature in a range of 750 to 880° C. and a holding time in a range of 20 to 50 hours, and then cooling the coated NdFeB magnet along with the processing equipment, thereby obtaining a NdFeB magnet with grain boundary diffusion; and

TABLE 3 the testing results of the performance of the magnets from embodiments 16 to 23

| Embodiment No. | Holding temperature in step (3) | Tempering temperature in step (4) | Coercive force (kOe) | | Remanence (kGs) | |
|---|---|---|---|---|---|---|
| | | | Before treatment | After treatment | Before treatment | After treatment |
| Embodiment 16 | 750° C. | 420° C. | 13.08 | 24.3 | 14.37 | 13.93 |
| Embodiment 17 | 750° C. | 460° C. | 13.08 | 24.5 | 14.37 | 13.95 |
| Embodiment 18 | 800° C. | 550° C. | 13.08 | 24.90 | 14.37 | 13.92 |
| Embodiment 19 | 800° C. | 630° C. | 13.08 | 24.50 | 14.37 | 13.98 |
| Embodiment 20 | 850° C. | 460° C. | 13.08 | 25.78 | 14.37 | 13.83 |
| Embodiment 21 | 850° C. | 630° C. | 13.08 | 25.25 | 14.37 | 13.82 |
| Embodiment 1 | 700° C. | 500° C. | 13.08 | 24.07 | 14.37 | 14.04 |
| Embodiment 22 | 650° C. | 500° C. | 13.08 | 18.78 | 14.37 | 14.23 |
| Embodiment 23 | 880° C. | 420° C. | 13.08 | 25.50 | 14.37 | 13.76 |
| Comparative embodiment 2 | 600° C. | 500° C. | 13.08 | 14.50 | 14.37 | 14.30 |
| Comparative embodiment 3 | 800° C. | 660° C. | 13.08 | 15.45 | 14.37 | 14.21 |

(4): tempering the NdFeB magnet with grain boundary diffusion, thereby obtaining uniformly coated outside surfaces of principal phase particles with a continuous rare-earth rich thin layer, wherein said tempering is carried out at a tempering temperature in a range of 420 to 460° C. for a tempering time in a range of 2 to 10 hours, wherein a required size of the two composite targets is 0.5 to 3 mm in thickness, 180 to 300 mm in length and 100 to 240 mm in width.

2. The method according to claim 1, wherein: in (1), the two composite targets are prepared by a method comprising:
weighing raw materials according to the ratio of the chemical formula of the composite target;
placing the raw materials in a vacuum medium frequency induction furnace; and
forming the composite target with the required size by smelting, casting, forging, hot-rolling, cool-rolling and machining, in that order.

3. The method according to claim 1, wherein: in (2), the process of cleaning the surface comprises:
placing the NdFeB magnet in a degreasing tank and soaking for 10 to 15 minutes to remove greasy dirt on the surface of the magnet, and then
performing a first water-washing, acid-washing, a second water-washing and ultrasonic treatment, in that order, and finally
blow drying the surface of the NdFeB magnet.

4. The method according to claim 1, wherein:
a thickness of the NdFeB magnet to be treated is in a range of 1 to 8 mm.

5. The method according to claim 1, wherein: in (3), the stack comprising the NdFeB magnet to be treated sandwiched between the two composite targets has a composite target surface area that is larger than that of the NdFeB magnet to be treated.

6. The method according to claim 1, wherein: the specified condition in (3) further comprises:
a vacuum degree of not more than $10^{-3}$ Pa, and
a temperature after cooling along with the processing equipment of no more than 50° C.

7. The method according to claim 1, wherein: in (4), the process of tempering comprises:
cooling the NdFeB magnet to room temperature after tempering.

8. The method according to claim 2, wherein:
the smelting is conducted using a vacuum medium frequency induction furnace wherein a vacuum degree is not higher than $10^{-2}$ Pa.

9. The method according to claim 3, wherein:
a time of the acid-washing is in a range of 20 to 45 seconds and a time of the ultrasonic treatment is in a range of 20 to 45 seconds.

10. The method according to claim 6, wherein: in (3), the holding temperature is in a range of 700 to 750° C. and the holding time is in a range of 20 to 35 hours.

11. The method according to claim 1, wherein the vacuum degree is of from $1 \times 10^{-6}$ Pa to not more than $5 \times 10^{-4}$ Pa.

12. The method according to claim 1, wherein the holding temperature is in a range of 750 to 850° C.

13. The method according to claim 1, wherein the holding temperature is in a range of 800 to 850° C.

14. A method for preparing a rare-earth permanent magnetic material, said method comprising:

(1): preparing two composite targets having a chemical formula of $Tb_{98}Al_2$,
(2): machining a sintered NdFeB magnet to produce a magnet with required shape and size, and then cleaning a surface of the magnet with required shape and size and drying, thereby obtaining a NdFeB magnet to be treated;
(3): alternately stacking the two composite targets and the NdFeB magnet to be treated, such that both of a topmost layer and a bottommost layer of the stack are the composite targets, placing the stack in processing equipment, coating the surface of the NdFeB magnet to be treated with a metal film under a specified condition using the composite target as an evaporation source and thereby generating grain boundary diffusion, wherein the specified condition is both a holding temperature in a range of 750 to 880° C. and a holding time in a range of 20 to 50 hours, and then cooling the coated NdFeB magnet along with the processing equipment, thereby obtaining a NdFeB magnet with grain boundary diffusion; and
(4): tempering the NdFeB magnet with grain boundary diffusion, thereby obtaining uniformly coated outside surfaces of principal phase particles with a continuous rare-earth rich thin layer, wherein said tempering is carried out at a tempering temperature in a range of 420 to 460° C. for a tempering time in a range of 2 to 10 hours,
wherein a required size of the two composite targets is 0.5 to 3 mm in thickness, 180 to 300 mm in length and 100 to 240 mm in width.

15. A method for preparing a rare-earth permanent magnetic material, said method comprising:
(1): preparing two composite targets having a chemical formula of $Tb_{95.9}Dy_{0.4}Nd_{0.7}Zn_2Sn_1$,
(2): machining a sintered NdFeB magnet to produce a magnet with required shape and size, and then cleaning a surface of the magnet with required shape and size and drying, thereby obtaining a NdFeB magnet to be treated;
(3): alternately stacking the two composite targets and the NdFeB magnet to be treated, such that both of a topmost layer and a bottommost layer of the stack are the composite targets, placing the stack in processing equipment, coating the surface of the NdFeB magnet to be treated with a metal film under a specified condition using the composite target as an evaporation source and thereby generating grain boundary diffusion, wherein the specified condition is both a holding temperature in a range of 750 to 880° C. and a holding time in a range of 20 to 50 hours, and then cooling the coated NdFeB magnet along with the processing equipment, thereby obtaining a NdFeB magnet with grain boundary diffusion; and
(4): tempering the NdFeB magnet with grain boundary diffusion, thereby obtaining uniformly coated outside surfaces of principal phase particles with a continuous rare-earth rich thin layer, wherein said tempering is carried out at a tempering temperature in a range of 420 to 460° C. for a tempering time in a range of 2 to 10 hours,
wherein a required size of the two composite targets is 0.5 to 3 mm in thickness, 180 to 300 mm in length and 100 to 240 mm in width.

* * * * *